United States Patent
Shin et al.

(10) Patent No.: US 8,390,353 B2
(45) Date of Patent: Mar. 5, 2013

(54) DUTY CYCLE CORRECTION CIRCUIT

(75) Inventors: Dong Suk Shin, Icheon-si (KR); Kwang Jin Na, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/332,964

(22) Filed: Dec. 21, 2011

(65) Prior Publication Data

US 2013/0002323 A1  Jan. 3, 2013

(30) Foreign Application Priority Data

Jun. 28, 2011 (KR) ........................ 10-2011-0062846

(51) Int. Cl.
*H03K 3/017* (2006.01)
(52) U.S. Cl. ........................ 327/175; 327/172
(58) Field of Classification Search ........................ None
See application file for complete search history.

(56) References Cited

U.S. PATENT DOCUMENTS

| | | | | |
|---|---|---|---|---|
| 7,863,955 B2* | 1/2011 | Kwon et al. | ................... | 327/175 |
| 7,990,194 B2* | 8/2011 | Shim | ............................. | 327/158 |
| 8,207,772 B2* | 6/2012 | Shin | ............................. | 327/175 |
| 8,253,455 B2* | 8/2012 | Hyun et al. | ................... | 327/147 |
| 8,274,318 B2* | 9/2012 | Lee | ............................. | 327/175 |
| 2009/0058482 A1* | 3/2009 | Kim et al. | ................... | 327/175 |
| 2009/0128207 A1* | 5/2009 | Chang et al. | ................... | 327/175 |
| 2010/0060334 A1* | 3/2010 | Abe et al. | ...................... | 327/158 |
| 2010/0284489 A1* | 11/2010 | Bae et al. | ...................... | 375/296 |
| 2010/0289542 A1* | 11/2010 | Yun et al. | ...................... | 327/158 |
| 2011/0128059 A1* | 6/2011 | Kim et al. | ...................... | 327/175 |

FOREIGN PATENT DOCUMENTS

KR  100915813 B1  8/2009

* cited by examiner

*Primary Examiner* — Cassandra Cox
(74) *Attorney, Agent, or Firm* — William Park & Associates Ltd.

(57) ABSTRACT

A duty cycle correction circuit includes a duty correction block configured to generate a first pre-corrected signal and a second pre-corrected signal in response to a duty code and an input signal; a duty-corrected signal generation block configured to generate a duty-corrected signal in response to a first select signal, a second select signal, the first pre-corrected signal and the second pre-corrected signal; and a control block configured to generate the duty code, the first select signal and the second select signal in response to the duty-corrected signal and the input signal.

20 Claims, 3 Drawing Sheets

DUTY CYCLE CORRECTION CIRCUIT

CROSS-REFERENCES TO RELATED APPLICATION

The present application claims priority under 35 U.S.C. §119(a) to Korean application number 10-2011-0062846, filed on Jun. 28, 2011, in the Korean Intellectual Property Office, which is incorporated herein by reference in its entirety as set forth in full.

BACKGROUND

1. Technical Field

The present invention relates generally to a semiconductor integrated circuit, and more particularly, to a duty cycle correction circuit.

2. Related Art

A semiconductor memory apparatus may operate in synchronization with a clock signal. Here, the clock signal would be understood as an ideal clock signal if a high level duration and a low level duration have the same length.

In order to generate a clock signal with a high level duration and a low level duration having the same length, a semiconductor memory apparatus may have a duty cycle correction circuit.

SUMMARY

In an embodiment of the present invention, a duty cycle correction circuit includes: a duty correction block configured to generate a first pre-corrected signal and a second pre-corrected signal in response to a duty code and an input signal; a duty-corrected signal generation block configured to generate a duty-corrected signal in response to a first select signal, a second select signal, the first pre-corrected signal and the second pre-corrected signal; and a control block configured to generate the duty code, the first select signal and the second select signal in response to the duty-corrected signal and the input signal.

In an embodiment of the present invention, a duty cycle correction circuit includes: a duty correction block configured to shorten a specified level duration of an input signal by a duration corresponding to a duty code and generate a first pre-corrected signal, and lengthen the specified level duration of the input signal by the duration corresponding to the duty code and generate a second pre-corrected signal; a duty-corrected signal generation block configured to output one of the first pre-corrected signal and the second pre-corrected signal as a duty-corrected signal in response to a first select signal and a second select signal, and determine a level of the duty-corrected signal when one of the first and second pre-corrected signals is outputted as the duty-corrected signal but then the other of the first and second pre-corrected signals is outputted as the duty-corrected signal, according to a combination of levels of the first and second pre-corrected signals; and a control block configured to detect a duty of the duty-corrected signal and generate the duty code and the first and second select signals.

In an embodiment of the present invention, a duty cycle correction circuit includes: a duty correction block configured to correct a duty ratio of an input signal according to a duty code and generate a first pre-corrected signal and a second pre-corrected signal; a duty-corrected signal generation block configured to generate a duty-corrected signal in response to a first select signal, a second select signal, the first pre-corrected signal and the second pre-corrected signal; and a control block configured to detect a duty ratio of the duty-corrected signal and generate the duty code and a pre-select signal, and perform control such that the first and second select signals have a duration during which they overlap with each other when the pre-select signal transitions, in response to the pre-select signal and the input signal.

BRIEF DESCRIPTION OF THE DRAWINGS

Features, aspects, and embodiments are described in conjunction with the attached drawings, in which.

DETAILED DESCRIPTION

Hereinafter, a duty cycle correction circuit according to the present invention will be described below with reference to the accompanying drawings through exemplary embodiments.

Figure 1:
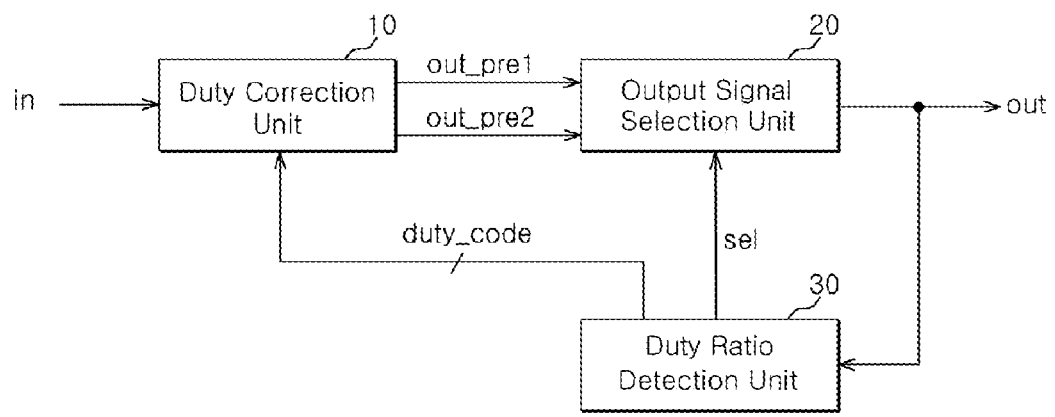
FIG. 1 is a configuration diagram of a duty cycle correction circuit in accordance with an embodiment of the present invention.

Referring to FIG. 1, a duty cycle correction circuit of a semiconductor memory apparatus in accordance with an embodiment of the present invention includes a duty correction unit 10, an output signal selection unit 20, and a duty ratio detection unit 30.

The duty correction unit 10 is configured to shorten a duration of a certain level of an input signal in by a duration corresponding to a duty code duty_code and output a first pre-corrected signal out_pre1. Also, the duty correction unit 10 is configured to lengthen a duration of a certain level of the input signal is in by a duration corresponding to the duty code duty_code and output a second pre-corrected signal out_pre2.

The output signal selection unit 20 is configured to output the first pre-corrected signal out_pre1 or the second pre-corrected signal out_pre2 as a duty-corrected signal out in response to a select signal sel.

The duty ratio detection unit 30 is configured to detect the duty ratio, that is, the lengths of a high level duration and a low level duration, of the duty-corrected signal out, and generate the duty code duty_code and the select signal sel.

In the duty cycle correction circuit of a semiconductor memory apparatus, as the duty ratio approaches 50%, that is, as the lengths of the high level duration and the low level duration of the duty-corrected signal out become equal, the level of the select signal sel changes frequently. In other words, if the duty ratio of the duty-corrected signal out approaches 50% and also enters the detection error range of the duty ratio detection unit 30, the level of the select signal sel changes frequently.

Accordingly, the switching of the duty-corrected signal out between the first pre-corrected signal out_pre1 and the second pre-corrected signal out_pre2 frequently occurs at the output signal selection unit 20.

The frequent switching operations of the output signal selection unit 20 may serve as jitter components of the duty-corrected signal out.

Figure 2:
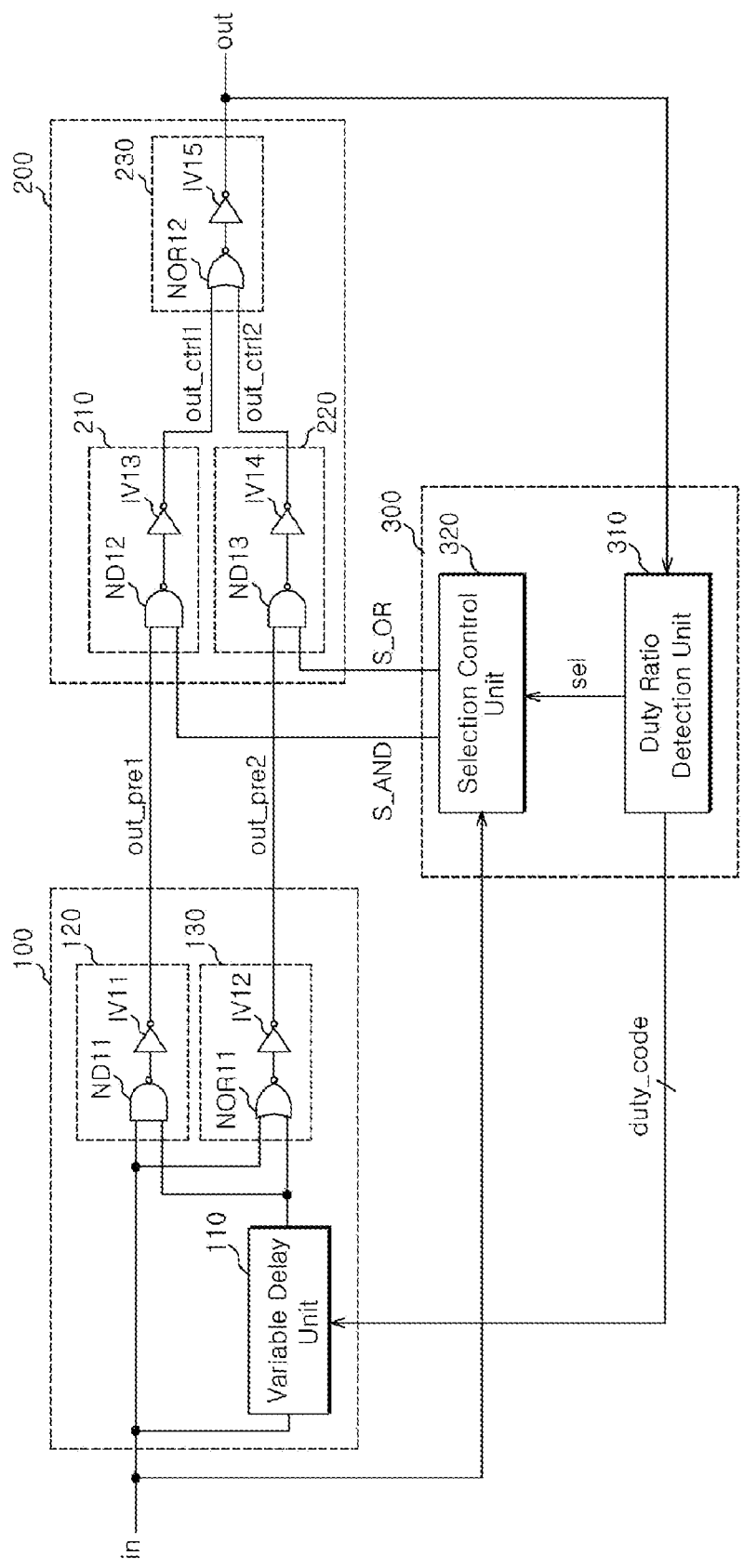
FIG. 2 is a configuration diagram of a duty cycle correction circuit in accordance with an embodiment of the present invention.

Referring to FIG. 2, a duty cycle correction circuit in accordance with an embodiment of the present invention includes a duty correction block 100, a duty-corrected signal generation block 200, and a control block 300.

The duty correction block 100 is configured to generate a first pre-corrected signal out_pre1 and a second pre-corrected signal out_pre2 in response to a duty code duty_code and an input signal in. For example, the duty correction block 100 corrects the duty ratio of the input signal in according to the duty code duty_code and generates the first and second pre-corrected signals out_pre1 and out_pre2. In detail, the duty correction block 100 shortens a duration of a certain level, e.g., a high level duration, of the input signal in by a duration corresponding to the duty code duty_code and generates the first pre-corrected signal out_pre1. Also, the duty correction block 100 lengthens a duration of a certain level, e.g., a high level duration of the input signal in by a duration corresponding to the duty code duty_code and generates the second pre-corrected signal out_pre2.

The duty correction block 100 includes a variable delay unit 110, and first and second pre-corrected signal generation units 120 and 130.

The variable delay unit 110 is configured to delay the input signal in by a delay time corresponding to the duty code duty_code. For example, the variable delay unit 110 lengthens the delay time if the code value of the duty code duty_code increases and shortens the is delay time if the code value of the duty code duty_code decreases.

The first pre-corrected signal generation unit 120 is configured to generate the first pre-corrected signal out_pre1 with a high level when both the input signal in and the output signal of the variable delay unit 110 have high levels.

The first pre-corrected signal generation unit 120 includes a first NAND gate ND11 and a first inverter IV11. The first NAND gate ND11 receives the input signal in and the output signal of the variable delay unit 110. The first inverter IV11 receives the output signal of the first NAND gate ND11 and outputs the first pre-corrected signal out_pre1.

The second pre-corrected signal generation unit 130 is configured to generate the second pre-corrected signal out_pre2 with a high level when at least one of the input signal in and the output signal of the variable delay unit 110 has a high level.

The second pre-corrected signal generation unit 130 includes a first NOR gate NOR11 and a second inverter IV12. The first NOR gate NOR11 receives the input signal in and the output signal of the variable delay unit 110. The second inverter IV12 receives the output signal of the first NOR gate NOR11 and outputs the second pre-corrected signal out_pre2.

The duty-corrected signal generation block 200 is configured to generate a duty-corrected signal out in response to a first select signal S_AND, a second select signal S_OR, the first pre-corrected signal out_pre1 and the second pre-corrected signal out_pre2. For example, the duty-corrected signal generation block 200 outputs a signal which is a result of OR operation of the first pre-corrected signal out_pre1 and the second pre-corrected signal out_pre2 as the duty-corrected signal out according to the first select signal S_AND and the second select signal S_OR. In addition, the switching of the duty-corrected signal out, i.e., the switching between results of OR operation of the first pre-corrected signal out_pre1 and the second pre-corrected signal out_pre2 is performed according to the first select signal S_AND and the second select signal S_OR.

The duty-corrected signal generation block 200 includes a first control output unit 210, a second control output unit 220, and a signal combination unit 230.

The first control output unit 210 is configured to output the first pre-corrected signal out_pre1 as a first control output signal out_ctrl1 when the first select signal S_AND is enabled to a high level, and locks the first control output signal out_ctrl1 to a certain level, e.g., a low level, when the first select signal S_AND is disabled to a low level.

The first control output unit 210 includes a second NAND gate ND12 and a third inverter IV13. The second NAND gate ND12 receives the first select signal S_AND and the first pre-corrected signal out_pre1. The third inverter IV13 receives the output signal of the second NAND gate ND12 and outputs the first control output signal out_ctrl1.

The second control output unit 220 is configured to output is the second pre-corrected signal out_pre2 as a second control output signal out_ctrl2 when the second select signal S_OR is enabled to a high level, and locks the second control output signal out_ctrl2 to a certain level, e.g., a low level, when the second select signal S_OR is disabled to a low level.

The second control output unit 220 includes a third NAND gate ND13 and a fourth inverter IV14. The third NAND gate ND13 receives the second select signal S_OR and the second pre-corrected signal out_pre2. The fourth inverter IV14 receives the output signal of the third NAND gate ND13 and outputs the second control output signal out_ctrl2.

The signal combination unit 230 is configured to generate the duty-corrected signal out with a high level when at least one of the first control output signal out_ctrl1 and the second control output signal out_ctrl2 has a high level. For example, the signal combination unit 230 outputs a signal which is a result of OR operation of the first and second control output signals out_ctrl1 and out_ctrl2. When at least one of the first control output signal out_ctrl1 and the second control output signal out_ctrl2 has a high level, the duty-corrected signal out has a high level, and when both the first control output signal out_ctrl1 and the second control output signal out_ctrl2 have low levels, the duty-corrected signal out has a low level.

The signal combination unit 230 includes a second NOR gate NOR12 and a fifth inverter IV15. The second NOR gate NOR12 is receives the first and second control output signals out_ctrl1 and out_ctrl2. The fifth inverter IV15 receives the output signal of the second NOR gate NOR12 and outputs the duty-corrected signal out.

The control block 300 is configured to generate the duty code duty_code and the first and second select signals S_AND and S_OR in response to the duty-corrected signal out and the input signal in. For example, the control block 300 generates the duty code duty_code in response to the duty-corrected signal out and generates the first and second select signals S_AND and S_OR in response to the duty-corrected signal out and the input signal in. In detail, the control block 300 detects the duty ratio of the duty-corrected signal out and generates the duty code duty_code and a pre-select signal sel, and determines a duration for which the first and second select signals S_AND and S_OR are to be simultaneously enabled when the pre-select signal sel transitions according to the pre-select signal sel and the input signal in.

The control block 300, for example, includes a duty ratio detection unit 310 and a selection control unit 320.

The duty ratio detection unit 310 is configured to detect the duty ratio of the duty-corrected signal out and generate the duty code duty_code and the pre-select signal sel. For example, the duty ratio detection unit 310 compares the lengths of the high level duration and the low level duration of the duty-corrected signal out, generates the pre-select signal sel, and increases or decreases the code value of the duty code duty_code in response to the pre-select is signal sel.

The selection control unit 320 is configured to generate the first and second select signals S_AND and S_OR in response to the pre-select signal sel and the input signal in. For example, the selection control unit 320 determines whether or not to enable the first and second select signals S_AND and S_OR, in response to the pre-select signal sel, and determines the disable timing of the first and second select signals S_AND and S_OR in response to the input signal in. In detail, in the state in which one of the first and second select signals S_AND and S_OR is enabled, if the level of the pre-select signal sel changes (e.g., from "0" to "1", or from "1" to "0"), the selection control unit 320 enables both the first and second select signals S_AND and S_OR. In addition, in the state in which both the first and second select signals S_AND and S_OR are enabled, if the input signal in changes to a certain level, e.g., a high level, the selection control unit 320 disables the other of the first and second select signals S_AND and S_OR.

According to an example, in the state in which the second select signal S_OR is enabled, if the pre-select signal sel is enabled, the selection control unit 320 enables the first select signal S_AND, and, in this state, if the input signal in changes to a high level, the selection control unit 320 disables the second select signal S_OR. Also, in the state in which the first select signal S_AND is enabled, if the pre-select signal sel is disabled, the selection control unit 320 enables the second select signal S_OR, and, in this state, if the input signal in changes to a high level, the selection control unit 320 disables the first select signal S_AND.

Figure 3:
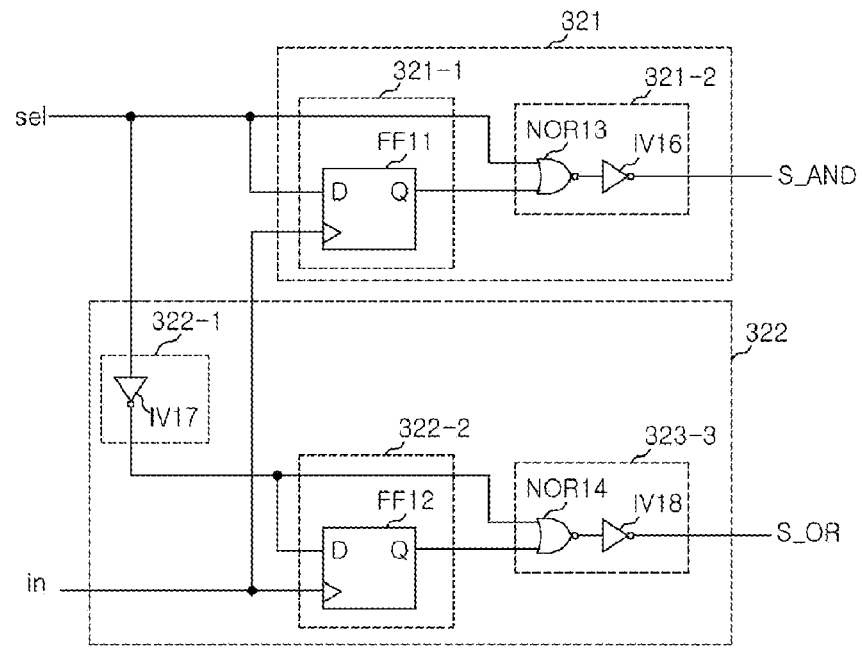
FIG. 3 is a configuration diagram of the selection control unit shown in FIG. 2.

Referring to FIG. 3, the selection control unit 320 includes first and second transition control sections 321 and 322.

The first transition control section 321 is configured to enable the first select signal S_AND to a high level when the pre-select signal sel is enabled, and disable the first select signal S_AND when the input signal in transitions to a high level after the pre-select signal sel is disabled.

The first transition control section 321 includes a first latch part 321-1 and a first select signal generation part 321-2.

The first latch part 321-1 includes a first flip-flop FF11. The first latch part 321-1 receives, stores and outputs the pre-select signal sel when the input signal in transitions to a high level.

The first select signal generation part 321-2 is configured to enable the first select signal S_AND to a high level when at least one of the output signal of the first latch part 321-1 and the pre-select signal sel is enabled to a high level, and disable the first select signal S_AND to a low level when both the output signal of the first latch part 321-1 and the pre-select signal sel are disabled to low levels.

The first select signal generation part 321-2 includes a third NOR gate NOR13 and a sixth inverter IV16. The third NOR gate NOR13 receives the pre-select signal sel and the output signal of the first latch part 321-1. The sixth inverter IV16 receives the output signal of the third NOR gate NOR13 and outputs the first select signal SAND.

The second transition control section 322 is configured to enable the second select signal S_OR to a high level when the pre-select signal sel is disabled, and disable the second select signal S_OR when the input signal in transitions to a high level after the pre-select signal sel is enabled.

The second transition control section 322 includes an inversion part 322-1, a second latch part 322-2, and a second select signal generation part 322-3.

The inversion part 322-1 includes a seventh inverter IV17. The inversion part 322-1 inverts the pre-select signal sel and outputs the inverted signal of the pre-select signal sel.

The second latch part 322-2 includes a second flip-flop FF12. The second latch part 322-2 receives, stores and outputs the output signal of the inversion part 322-1 when the input signal in transitions to a high level.

The second select signal generation part 322-3 is configured to enable the second select signal S_OR to a high level when at least one of the output signal of the second latch part 322-2 and the output signal of the inversion part 322-1 is enabled to a high level, and disable the second select signal S_OR when both the output signal of the second latch part 322-2 and the output signal of the inversion part 322-1 are disabled to low levels.

The second select signal generation part 322-3 includes a fourth NOR gate NOR14 and an eighth inverter IV18. The fourth NOR gate NOR14 receives the output signal of the inversion part 322-1 and the output signal of the second latch part 322-2. The eighth inverter IV18 receives the output signal of the fourth NOR gate NOR14 and generates the second select signal S_OR.

Operations of the duty cycle correction circuit in accordance with an embodiment of the present invention, configured as described above, will be described below with reference to FIGS. 1 to 4.

According to an example, if the input signal in is inputted to the duty correction block 100, the length of the high level duration of the input signal in is shortened by the duration corresponding to the duty code duty_code, and the first pre-corrected signal out_pre1 is generated. The length of the high level duration of the input signal in is lengthened by the duration corresponding to the duty code duty_code, and the second pre-corrected signal out_pre2 is generated.

One of the first and second pre-select signals out_pre1 and out_pre2 is outputted as the duty-corrected signal out in response to the first and second select signals S_AND and S_OR. In the case where the first pre-corrected signal out_pre1 is outputted as the duty-corrected signal out and then the second pre-corrected signal out_pre2 is outputted as the duty-corrected signal out, a certain duration level is determined according to the combination of the levels of the first and second pre-corrected signals out_pre1 and out_pre2. For example, when the first pre-corrected signal out_pre1 is outputted as the duty-corrected signal out and then the second pre-corrected signal out_pre2 is outputted as the duty-corrected signal out, if the first and second pre-corrected signals out_pre1 and out_pre2 have the same level, the level of the duty-corrected signal out is the same as the level of the first and second pre-corrected signals out_pre1 and out_pre2. When the first pre-corrected signal out_pre1 is outputted as the duty-corrected signal out and then the second pre-corrected signal out_pre2 is outputted as the duty-corrected signal out, if the first and second pre-corrected signals out_pre1 and out_pre2 have different levels, that is, one of the first and second pre-corrected signals out_pre1 and out_pre2 has a high level, the level of the duty-corrected signal out becomes a high level.

When the second pre-corrected signal out_pre2 is outputted as the duty-corrected signal out and then the first pre-corrected signal out_pre1 is outputted as the duty-corrected signal out, if the first and second pre-corrected signals out_pre1 and out_pre2 have the same level, the level of the duty-corrected signal out is the same as the level of the first and second pre-corrected signals out_pre1 and out_pre2, and if the first and second pre-corrected signals out_pre1 and out_pre2 have different levels, that is, one of the first and second pre-corrected signals out_pre1 and out_pre2 has a high level, the level of the duty-corrected signal out becomes a high level.

Here, when a signal source of the duty-corrected signal out is switched from one to the other of the first and second control output units 210 and 220, the first and second pre-corrected signals out_pre1 and out_pre2 are prevented from being locked to a low is level in a certain duration.

Signals which select the signal source of the duty-corrected signal out is the first and second select signals S_AND and S_OR. Therefore, the selection control unit 320 shown in FIG. 2 generates the first and second select signals S_AND and S_OR which have opposite levels and of which enable durations overlap with each other for a certain time.

Figure 4:
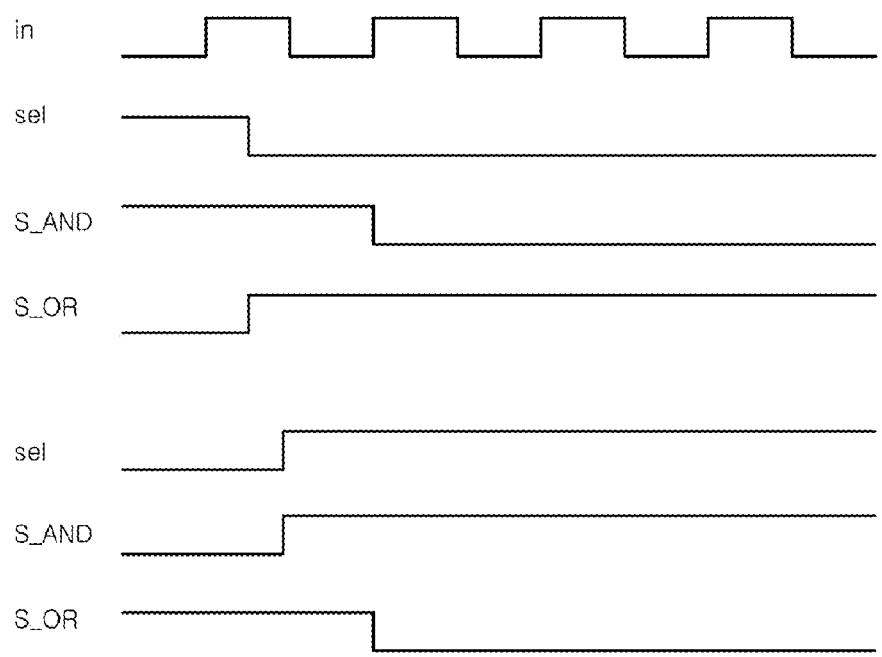
FIG. 4 is a timing diagram of the duty cycle correction circuit according to an embodiment of the present invention.

Referring to FIG. 4, the second select signal S_OR is enabled to a high level when the pre-select signal sel of a high level is disabled to a low level, and the first select signal S_AND is disabled to a low level when the input signal in transitions to a high level after the pre-select signal sel is disabled to a low level. That is to say, the enable durations of the first and second select signals S_AND and S_OR overlap with each other from a time when the pre-select signal sel is disabled to a low level to a time when the input signal in transitions to a high level.

Also, the first select signal S_AND is enabled to a high level when the pre-select signal sel of a low level is enabled to a high level, and the second select signal S_OR is disabled to a low level when the input signal in transitions to a high level after the pre-select signal sel is enabled to a high level. That is to say, the enable durations of the first and second select signals S_AND and S_OR overlap with each other from a time when the pre-select signal sel is enabled to a high level to a time when the input signal in transitions to a high level.

Hence, when the duty-corrected signal out is switched from is the first pre-corrected signal out_pre1 to the second pre-corrected signal out_pre2 or from the second pre-corrected signal out_pre2 to the first pre-corrected signal out_pre1, the duty-corrected signal out has a duration which is influenced by both the first and second pre-corrected signals out_pre1 and out_pre2. Accordingly, the duty cycle correction circuit according to an embodiment of the present invention may reduce the switching noise of the duty-corrected signal out as a final output signal. For reference, in an embodiment of the present invention, when the duty-corrected signal out is switched from the first pre-corrected signal out_pre1 to the second pre-corrected signal out_pre2 or from the second pre-corrected signal out_pre2 to the first pre-corrected signal out_pre1, that is, when pre-select signal sel transitions, corresponds to when the duty ratio of the duty-corrected signal out reaches 50%, and thus corresponds to when the duty ratios of the first and second pre-corrected signals out_pre1 and out_pre2 reach 50%. Thus, the first and second pre-corrected signals out_pre1 and out_pre2 do not serve as jitter components of the duty-corrected signal out, but serve to increase the driving force of the duty-corrected signal out.

While certain embodiments have been described above, it will be understood to those skilled in the art that the embodiments described are by way of example only. Accordingly, the duty cycle correction circuit described herein should not be limited based on the described embodiments. Rather, the duty cycle correction circuit described herein should only be limited in light of the claims that is follow when taken in conjunction with the above description and accompanying drawings.

What is claimed is:

1. A duty cycle correction circuit comprising:
    a duty correction block configured to generate a first pre-corrected signal and a second pre-corrected signal in response to a duty code and an input signal;
    a duty-corrected signal generation block configured to generate a duty-corrected signal in response to a first select signal, a second select signal, the first pre-corrected signal and the second pre-corrected signal; and
    a control block configured to generate the duty code, the first select signal and the second select signal in response to the duty-corrected signal and the input signal.

2. The duty cycle correction circuit according to claim 1, wherein the duty correction block generates the first pre-corrected signal by shortening a duration of a first level of the input signal by a duration corresponding to the duty code, and generates the second pre-corrected signal by lengthening the duration of the first level of the input signal by the duration corresponding to the duty code.

3. The duty cycle correction circuit according to claim 2, wherein the duty correction block comprises:
    a variable delay unit configured to delay the input signal by a delay time corresponding to the duty code;
    a first pre-corrected signal generation unit configured to generate the first pre-corrected signal with a high level when both the input signal and an output signal of the variable delay unit have high levels; and
    a second pre-corrected signal generation unit configured to generate the second pre-corrected signal with a high level when at least one of the input signal and the output signal of the variable delay unit has a high level.

4. The duty cycle correction circuit according to claim 1, wherein the duty-corrected signal generation block comprises:
    a first control output unit configured to output the first pre-corrected signal as a first control output signal when the first select signal is enabled and lock the first control output signal to a first level when the first select signal is disabled;
    a second control output unit configured to output the second pre-corrected signal as a second control output signal when the second select signal is enabled and lock the second control output signal to the first level when the second select signal is disabled; and
    a signal combination unit configured to generate the duty-corrected signal with a high level when at least one of the first control output signal and the second control output signal has a high level.

5. The duty cycle correction circuit according to claim 1, wherein the control block comprises:
    a duty ratio detection unit configured to detect a duty ratio of the duty-corrected signal and generate the duty code and a pre-select signal; and
    a selection control unit configured to generate the first select signal and the second select signal in response to the pre-select signal and the input signal.

6. The duty cycle correction circuit according to claim 5, wherein the selection control unit determines whether or not to enable the first and second select signals in response to the pre-select signal, and determines disable timing of the first and second select signals in response to the input signal.

7. The duty cycle correction circuit according to claim 6, is wherein the selection control unit enables one of the first and second select signals in response to the pre-select signal, and disables the other of the first and second select signals in response to the pre-select signal and the input signal.

8. The duty cycle correction circuit according to claim 7, wherein the selection control unit enables the first select signal when the pre-select signal is enabled and disables the second select signal when the pre-select signal is enabled and the input signal transitions to a second level, and enables the second signal when the pre-select signal is disabled and disables the first select signal when the pre-select signal is disabled and the input signal transitions to the second level.

9. The duty cycle correction circuit according to claim 8, wherein the selection control unit comprises:
   a first transition control section configured to enable the first select signal when the pre-select signal is enabled and disable the first select signal when the pre-select signal is disabled and the input signal transitions to the second level; and
   a second transition control section configured to enable the second select signal when the pre-select signal is disabled and disable the second select signal when the pre-select signal is enabled and the input signal transitions to the second level.

10. The duty cycle correction circuit according to claim 9, wherein the first transition control section comprises:
    a latch part configured to receive, store and output the pre-select signal when the input signal transitions to the second level; and
    a select signal generation part configured to enable the first select signal when at least one of an output signal of the latch part and the pre-select signal is enabled, and disable the first select signal when both the output signal of the latch part and the pre-select signal are disabled.

11. The duty cycle correction circuit according to claim 9, wherein the second transition control section comprises:
    an inversion part configured to invert the pre-select signal and output the inverted signal of the pre-select signal;
    a latch part configured to receive, store and output an output signal of the inversion part when the input signal transitions to the second level; and
    a select signal generation part configured to enable the second select signal when at least one of an output signal of the latch part and the output signal of the inversion part is enabled, and disable the second select signal when both the output signal of the latch part and the output signal of the inversion part are disabled.

12. A duty cycle correction circuit comprising:
    is a duty correction block configured to shorten a duration of a first level of an input signal by a duration corresponding to a duty code and generate a first pre-corrected signal, and lengthen the duration of the first level of the input signal by the duration corresponding to the duty code and generate a second pre-corrected signal;
    a duty-corrected signal generation block configured to output one of the first pre-corrected signal and the second pre-corrected signal as a duty-corrected signal in response to a first select signal and a second select signal, and determine a level of the duty-corrected signal when one of the first and second pre-corrected signals is outputted as the duty-corrected signal and then the other of the first and second pre-corrected signals is outputted as the duty-corrected signal, according to a combination of levels of the first and second pre-corrected signals; and
    a control block configured to detect a duty of the duty-corrected signal and generate the duty code and the first and second select signals.

13. The duty cycle correction circuit according to claim 12, wherein the duty-corrected signal generation block comprises:
    a first control output unit configured to output the first pre-corrected signal as a first control output signal when the first select signal is enabled and lock the first control output signal to a second level when the first select signal is disabled;
    is a second control output unit configured to output the second pre-corrected signal as a second control output signal when the second select signal is enabled and lock the second control output signal to the second level when the second select signal is disabled; and
    a signal combination unit configured to output the other of the first and second control output signals as the duty-corrected signal when one of the first and second control output signals is locked to the second level, and transition the duty-corrected signal to a low level only when both the first and second control output signals become low levels if both the first and second control output signals are locked to the second level.

14. The duty cycle correction circuit according to claim 12, wherein the duty correction block comprises:
    a variable delay unit configured to delay the input signal by a delay time varying in response to the duty code;
    a first pre-corrected signal generation unit configured to generate the first pre-corrected signal with a high level when both the input signal and an output signal of the variable delay unit have high levels; and
    a second pre-corrected signal generation unit configured to generate the second pre-corrected signal with a low level when both the input signal and the output signal of the variable delay unit have low levels.

15. The duty cycle correction circuit according to claim 12, wherein the control block comprises:
    a duty ratio detection unit configured to detect a duty ratio of the duty-corrected signal and generate the duty code and a pre-select signal; and
    a selection control unit configured to generate the first select signal and the second select signal in response to the pre-select signal and the input signal.

16. A duty cycle correction circuit comprising:
    a duty correction block configured to correct a duty ratio of an input signal according to a duty code and generate a first pre-corrected signal and a second pre-corrected signal;
    a duty-corrected signal generation block configured to generate a duty-corrected signal in response to a first select signal, a second select signal, the first pre-corrected signal and the second pre-corrected signal; and
    a control block configured to detect a duty ratio of the duty-corrected signal and generate the duty code and a pre-select signal, and control such that the first and second select signals have an enable duration during which they overlap with each other when the pre-select signal transitions, in response to the pre-select signal and the input signal.

17. The duty cycle correction circuit according to claim 16, wherein the control block comprises:
    a duty ratio detection unit configured to compare a high level duration and a low level duration of the duty-corrected signal and generate the pre-select signal, and increase or decrease a code value of the duty code in response to the pre-select signal; and
    a selection control unit configured to enable one of the first and second select signals when the pre-select signal is enabled, and disable the other of the first and second select signals when the input signal transitions to a first level.

18. The duty cycle correction circuit according to claim 17, wherein the selection control unit comprises:
    a first transition control section configured to enable the first select signal when the pre-select signal is enabled and disable the first select signal when the pre-select signal is disabled and the input signal transitions to a high level; and a second transition control section configured to enable the second select signal when the pre-select signal is disabled and disable the second select signal when the pre-select signal is enabled and the input signal transitions to the high level.

19. The duty cycle correction circuit according to claim 18, wherein the first transition control section comprises:

a latch part configured to receive, store and output the pre-select signal when the input signal transitions to the high level; and a select signal generation part configured to enable the first select signal when at least one of an output signal of the latch part and the pre-select signal is enabled, and disable the first select signal when both the output signal of the latch part and the pre-select signal are disabled.

20. The duty cycle correction circuit according to claim 18, wherein the second transition control section comprises:

an inversion part configured to invert the pre-select signal and output the inverted signal of the pre-select signal;

a latch part configured to receive, store and output an output signal of the inversion part when the input signal transitions to the high level; and a select signal generation part configured to enable the second select signal when at least one of an output signal of the latch part and the output signal of the inversion part is enabled, and disable the second select signal when both the output signal of the latch part and the output signal of the inversion part are disabled.

* * * * *